United States Patent
Nalluri et al.

(10) Patent No.: US 9,690,883 B2
(45) Date of Patent: Jun. 27, 2017

(54) ASSOCIATING MATERIALS WITH BODIES IN A COMPUTER-AIDED DESIGN FILE

(71) Applicant: Siemens Product Lifecycle Management Software Inc., Plano, TX (US)

(72) Inventors: Sivarama Nalluri, Mason, OH (US); Satyanarayana Guduru, Mason, OH (US); Raymond Kok, East Windsor, NJ (US); Sunil Viswanathan, Cypress, CA (US)

(73) Assignee: SIEMENS PRODUCT LIFECYCLE MANAGEMENT SOFTWARE INC., Plano, TX (US)

( * ) Notice: Subject to any disclaimer, the term of this patent is extended or adjusted under 35 U.S.C. 154(b) by 622 days.

(21) Appl. No.: 14/298,397

(22) Filed: Jun. 6, 2014

(65) Prior Publication Data

US 2015/0356206 A1    Dec. 10, 2015

(51) Int. Cl.
   *G06F 17/50* (2006.01)
(52) U.S. Cl.
   CPC .................................... *G06F 17/50* (2013.01)
(58) Field of Classification Search
   USPC .................................. 703/2, 22; 700/97, 182
   See application file for complete search history.

(56) References Cited

U.S. PATENT DOCUMENTS

| | | |
|---|---|---|
| 5,552,995 A | 9/1996 | Sebastian |
| 6,220,743 B1 | 4/2001 | Campestre et al. |
| 6,477,438 B1 | 11/2002 | Sakai et al. |
| 6,801,818 B2 | 10/2004 | Kopcha |

(Continued)

FOREIGN PATENT DOCUMENTS

| | | |
|---|---|---|
| CN | 1953463 B | 6/2010 |
| CN | 102004943 B | 10/2013 |

(Continued)

OTHER PUBLICATIONS

Peng Wei-Ping et al., "Design and Implementation of an Integrated CAD/CAPP System Based on PDM," Wuhan University Journal of Natural Sciences, vol. 7, No. 2, pp. 161-168, Jun. 2002, 8 pages.

(Continued)

*Primary Examiner* — Thai Phan

(57) ABSTRACT

Various disclosed embodiments include a method for integrating material assignments between a computer-aided design (CAD) system and a product data management (PDM) or product lifecycle management (PLM) system, the method performed by a data processing system and comprising accessing a designed part in the CAD system, wherein the designed part includes one or more geometric entity objects. The method also comprising assigning one or more assignment objects from the PDM system to each of the one or more geometric entity objects. The method further comprising associating one or more material objects from the PDM system with the one or more assignment objects, wherein the one or more material objects identify one or more materials identified from the designed part. The method comprising generating a design object in the PDM system representing the designed part based on the one or more assignment objects and the one or more material objects.

20 Claims, 5 Drawing Sheets

(56) References Cited

U.S. PATENT DOCUMENTS

| | | |
|---|---|---|
| 7,103,434 B2 | 9/2006 | Chernyak et al. |
| 7,340,315 B2 | 3/2008 | Ozasa et al. |
| 7,403,833 B2 | 7/2008 | Heide et al. |
| 7,757,203 B2 | 7/2010 | Scholl et al. |
| 7,835,810 B2 | 11/2010 | Mifsud et al. |
| 7,894,920 B2 | 2/2011 | Mifsud et al. |
| 8,065,116 B2 | 11/2011 | Sims, Jr. |
| 8,095,341 B2 | 1/2012 | Sims, Jr. |
| 8,423,325 B2 | 4/2013 | Sims, Jr. |
| 8,509,933 B2 | 8/2013 | Steingart et al. |
| 8,560,286 B2 | 10/2013 | Favier |
| 8,584,029 B1* | 11/2013 | Gerde .................. G06F 3/0488 715/771 |
| 2005/0120010 A1 | 6/2005 | Philpott et al. |
| 2007/0265813 A1* | 11/2007 | Unal .................... G06T 7/0012 703/2 |
| 2008/0015720 A1 | 1/2008 | Oyasato et al. |
| 2008/0154749 A1 | 6/2008 | D'hooghe et al. |
| 2009/0063557 A1* | 3/2009 | MacPherson ......... G06T 11/206 |
| 2009/0083333 A1 | 3/2009 | Yamamoto et al. |
| 2011/0264591 A1 | 10/2011 | Song et al. |
| 2012/0084061 A1 | 4/2012 | Furumoto et al. |
| 2013/0231768 A1 | 9/2013 | Jensen et al. |
| 2014/0143005 A1 | 5/2014 | Jatla |
| 2014/0278269 A1* | 9/2014 | Winn ..................... G06F 17/50 703/1 |
| 2014/0324204 A1* | 10/2014 | Vidimce ............. B29C 67/0088 700/98 |

FOREIGN PATENT DOCUMENTS

| | | |
|---|---|---|
| CN | 102023859 B | 1/2014 |
| JP | 2004227295 A | 8/2004 |
| KR | 100603870 B1 | 7/2006 |
| KR | 1020100122354 | 11/2010 |
| TW | 200715155 A | 4/2007 |
| WO | WO 2012/085914 A1 | 6/2012 |

OTHER PUBLICATIONS

Youchon Oh et al. "Mapping product structures between CAD and PDM systems using UML," Computer-Aided Design, vol. 33, No. 7, pp. 521-529, Jun. 2001, 9 pages.

PCT Search Report dated Aug. 31, 2015, for Application No. PCT/US2015/032353, 11 pages.

PCT Search Report dated Oct. 16, 2015, for PCT Application PCT/US2015/032357, 11 pages.

\* cited by examiner

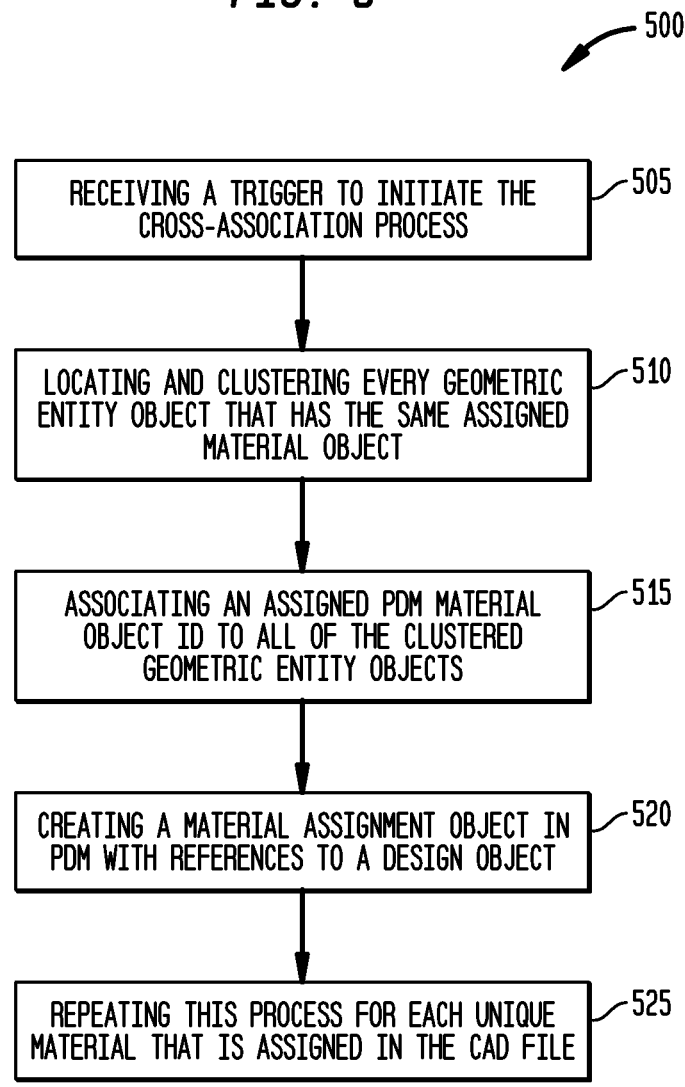

ASSOCIATING MATERIALS WITH BODIES IN A COMPUTER-AIDED DESIGN FILE

CROSS-REFERENCE TO RELATED APPLICATION(S)

This application shares some subject matter in common with, but is otherwise unrelated to, U.S. patent application Ser. No. 14/298,278 filed on Jun. 6, 2014 titled, "Refining of Material Definitions for Designed Parts", which is hereby incorporated by reference into the present application as if fully set forth herein.

TECHNICAL FIELD

The present disclosure is directed, in general, to computer-aided design, visualization, and manufacturing systems ("CAD/CAM systems"), product lifecycle management ("PLM") systems, and similar systems, that manage data for products and other items (collectively, "Product Data Management" systems or PDM systems).

BACKGROUND OF THE DISCLOSURE

Product Data Management (PDM) systems can be utilized to access computer-aided design (CAD) files from a CAD system. Improved systems for managing materials are desirable.

SUMMARY OF THE DISCLOSURE

Various disclosed embodiments include a method for integrating material assignments between a computer-aided design (CAD) system and a product data management (PDM) or product lifecycle management (PLM) system, the method performed by a data processing system and comprising accessing a designed part in the CAD system, wherein the designed part includes one or more geometric entity objects. The method also comprising assigning one or more assignment objects from the PDM system to each of the one or more geometric entity objects. The method further comprising associating one or more material objects from the PDM system with the one or more assignment objects, wherein the one or more material objects identify one or more materials identified from the designed part. The method comprising generating a design object in the PDM system representing the designed part based on the one or more assignment objects and the one or more material objects.

Various disclosed embodiments also include a data processing system including a processor. The data processing system also includes an accessible memory. The data processing system is configured to access a designed part in a computer-aided design (CAD) system, wherein the designed part includes one or more geometric entity objects. The data processing system is also configured to assign one or more assignment objects from a product data management (PDM) system to each of the one or more geometric entity objects. The data processing system is further configured to associate one or more material objects from the PDM system with the one or more assignment objects, wherein the one or more material objects identify one or more materials identified from the designed part. The data processing system is configured to generate a design object in the PDM system representing the designed part based on the one or more assignment objects and the one or more material objects.

Various disclosed embodiments further include a non-transitory computer-readable medium encoded with executable instructions that, when executed, cause one or more data processing systems to access a designed part in a computer-aided design (CAD) system, wherein the designed part includes one or more geometric entity objects. The non-transitory computer-readable medium encoded with executable instructions that, when executed, also cause the one or more data processing systems to assign one or more assignment objects from a product data management (PDM) system to each of the one or more geometric entity objects. The non-transitory computer-readable medium encoded with executable instructions that, when executed, further cause the one or more data processing systems to associate one or more material objects from the PDM system with the one or more assignment objects, wherein the one or more material objects identify one or more materials identified from the designed part. The non-transitory computer-readable medium encoded with executable instructions that, when executed, cause the one or more data processing systems to generate a design object in the PDM system representing the designed part based on the one or more assignment objects and the one or more material objects.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 5 illustrates a flowchart of a process in accordance with disclosed embodiments that may be performed, for example, by a data processing system in order to cross-associate materials in the PDM system with the one or more geometric entities of a CAD file.

DETAILED DESCRIPTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Figure 1:
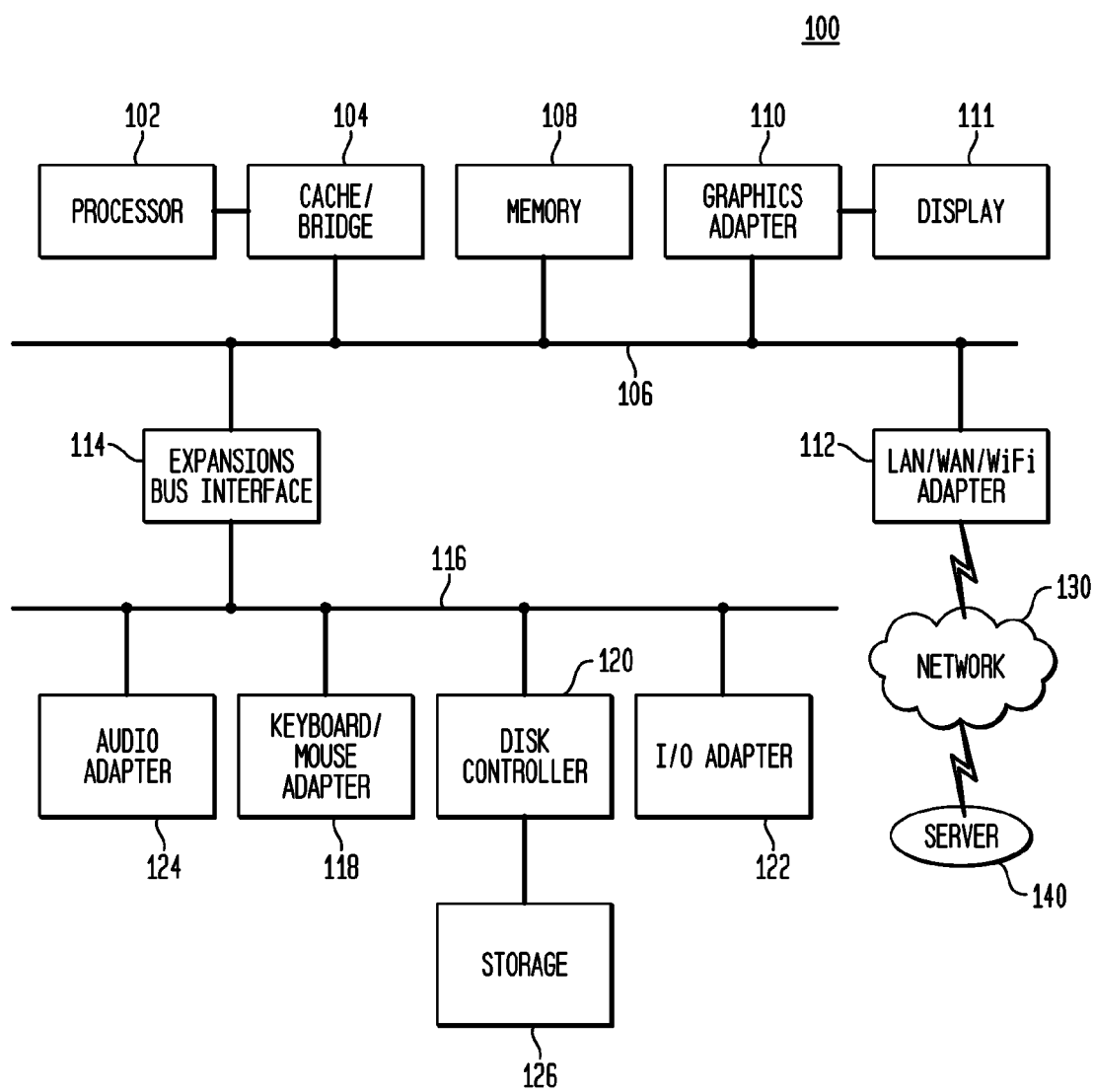
FIG. 1 illustrates a block diagram of a data processing system in which an embodiment can be implemented.

FIG. 1 illustrates a block diagram of a data processing system in which an embodiment can be implemented, for example as a CAD, PDM, or PLM (Product Lifecycle Management) system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. Wi-Fi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, track pointer, touchscreen, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Figure 2A:
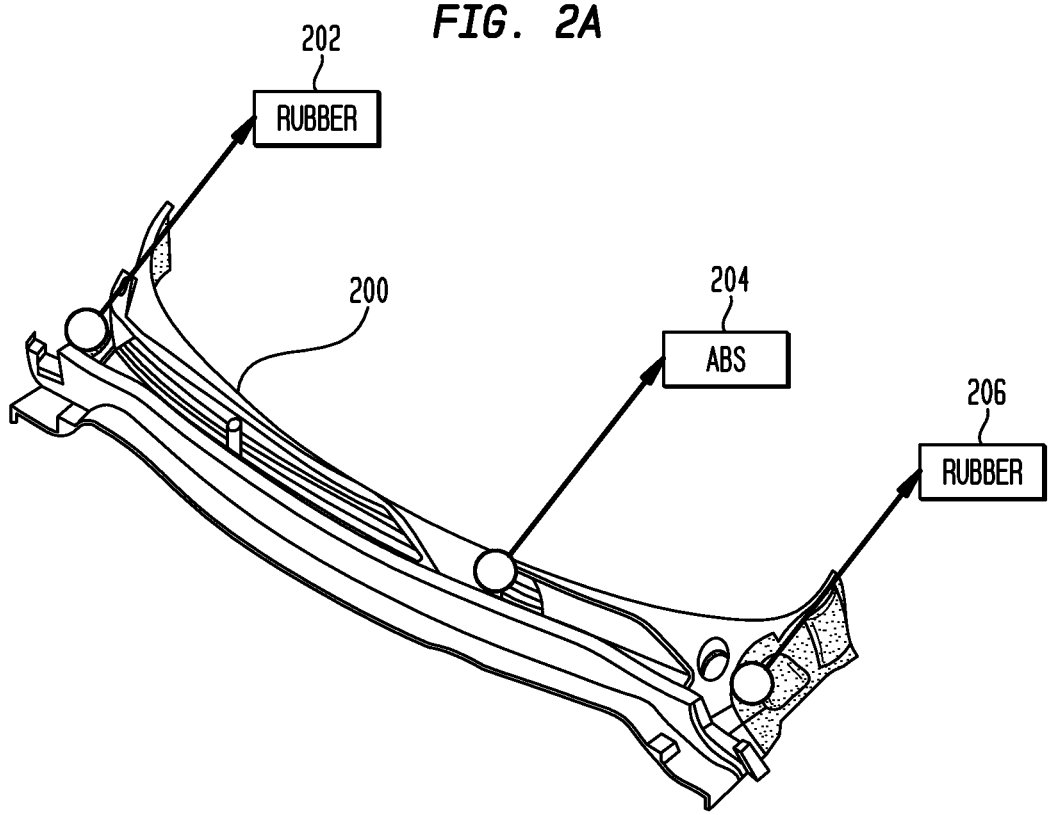
FIG. 2A illustrates an example of a piece part that includes multiple materials according to this disclosure.
Figure 2B:
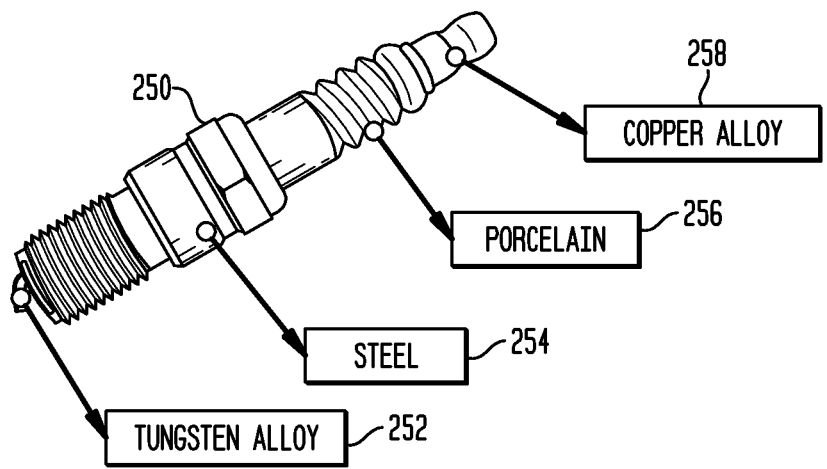
FIG. 2B illustrates an example of a CAD part file that includes multiple materials according to this disclosure.

There is an increasing trend of manufacturing parts (such as automotive parts) with multiple materials. Currently about 35% of automotive parts have multiple materials. The increasing trend can be due to many factors. For example, new manufacturing techniques such as friction welding, additive manufacturing (such as stereolithography (SLA), fused definition modeling (FDM), direct metal laser sintering (DMLS), and selective laser sintering (SLS)), bonded structures with phenolic, metals, resins, and adhesive have been developed. The mixing of metals and plastics in piece part design (such as chrome plated plastics) is used to produce better designs. Additionally, plating, coating, 3D printing, and echo friendly light-weight designs have also contributed to the increase in parts with multiple materials. FIG. 2A illustrates an example of a piece part 200 that includes multiple materials according to this disclosure. As illustrated in FIG. 2A, piece part 200 includes rubber material 202, acrylonitrile butadiene styrene (ABS) material 204, and rubber material 206. FIG. 2B illustrates an example of a CAD part file 250 that includes multiple materials according to this disclosure. As illustrated in FIG. 2B, CAD part file 250 includes a tungsten alloy material 252, a steel material 254, a porcelain material 256, and a copper alloy material 258.

However, parts with multiple materials consume a disproportional amount of engineering time (for example to perform regulatory analysis for controlled substances) while also creating errors due to missing material assignments and errors when calculating mass and center of gravity (CG). Precise tracking of multiple materials can be used during a part's lifecycle starting from a simple calculation of mass and CG in a CAD system to a calculation of a direct material and manufacturing costs, an amount of a regulatory substance, an amount of recyclable content, an impact on an environment, and otherwise in a PDM system.

Furthermore, material assignments made at the lower level entities in the CAD system representations such as on a solid-body, a surface, a curve, and a point may not be correctly transferred to the PDM system. For example, entities in a CAD representation may not be transferred to PDM at the lower entity levels for performance and scalability reasons. As disclosed herein, the need for representation of material assignments in a PDM system for correct transfer and tracking of material assignments between a CAD system and the PDM system without representing low-level geometric entities such as a solid-body, a surface, a curve, and a point in PDM is addressed.

In an embodiment, a material name as an attribute of a part in a PDM system can be tracked. When a part in a PDM system has only one material, using the material name as an attribute of the part in the PDM system can be a simple and effective approach to track the part. However, this approach becomes more complicated when the part has more than one material. For example, attributing a single material to a part can make scaling for parts with multiple materials more difficult because a material name is not always a reliable way to identify the material while taking into account different grades, gages, and treatments that can significantly impact the physical properties of the material represented in a CAD system or a PDM system. Furthermore, attributing a single material to a part can make scaling for parts with multiple materials more difficult because a first industry and a second industry may use the same part but the first industry may also require different materials or a different quantity of materials in the part than the second industry. By assigning a material name of a part as an attribute, manual handling practice outside the PLM system environment may be needed to synchronize material assignments between a CAD system and a PDM system which can be prone to error (such as miscalculations of mass and CG) and lost man power.

In an embodiment, a data processing system (such as an integrated Material Lifecycle Management system) can utilize material assignments to capture the fundamental relationship between geometry and a material. The data processing system can be used as the basis for precise tracking to calculate mass, CG, and otherwise. Furthermore, the data processing system can also use material assignments as key inputs to material data driven design validation. Assignments in PDM can be represented as PDM Assignment Objects that can have their own lifecycle and can be visualized, reviewed, approved. The integration between CAD and PDM can roll-up the CAD associations between materials and geometric entities to PDM Design objects in order to represent assignments appropriate for PDM. The number of assignments created can be the same as the number of materials. All CAD assignments that have the same material and the same application type can be rolled up into one assignment with combined volume.

Figure 3A:
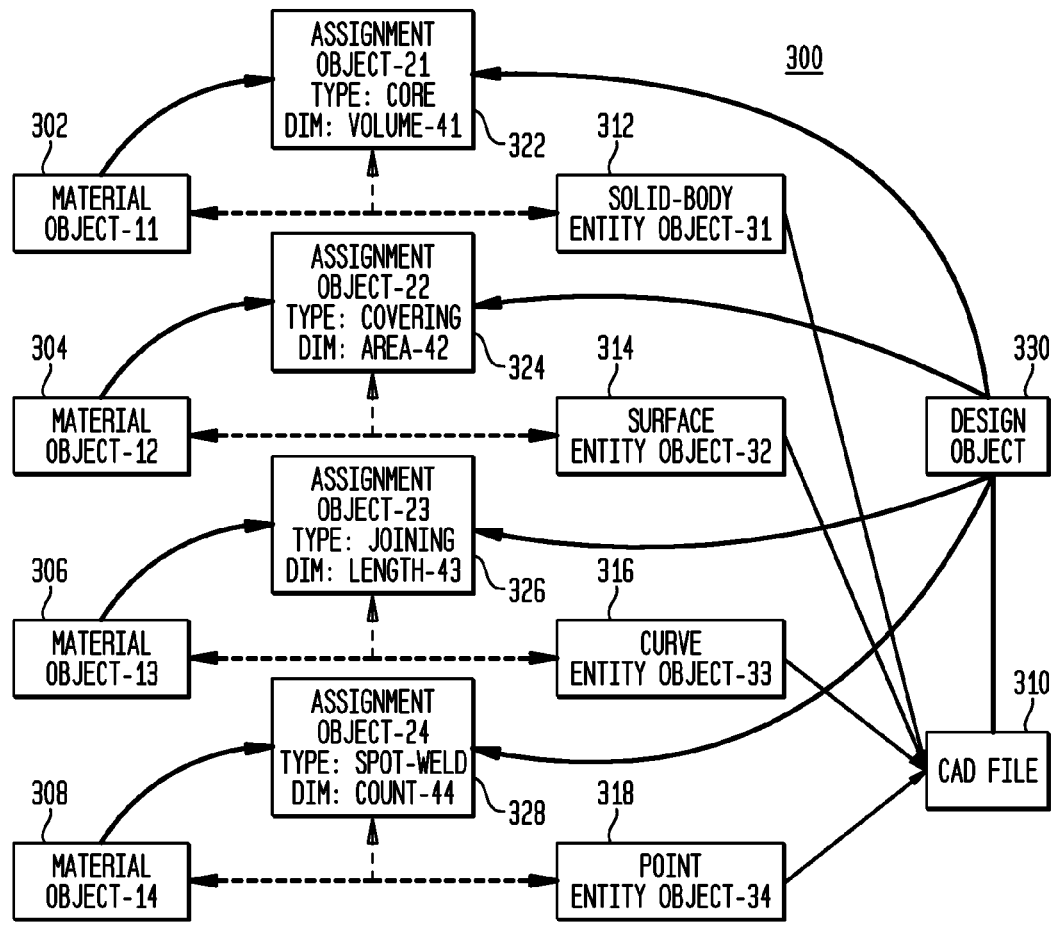
FIG. 3A illustrates an example diagram of modeling and integration of material assignments between a CAD system and a PDM system according to this disclosure.

FIG. 3A illustrates an example diagram 300 of modeling and integration of material assignments between a CAD system and a PDM system according to this disclosure. As illustrated in FIG. 3A, material objects 302, 304, 306, and 308 can be stored in a PDM system and can represent different materials. For example, a first material object 302 can represent tungsten, a second material object 304 can represent aluminum, a third material object 306 can represent copper, and a fourth material object 308 can represent a plastic.

Furthermore, a CAD file 310 can include a part (such as virtual part) including one or more geometric entities represented by entity objects 312, 314, 316, and 318. Entities can include solid bodies, surfaces, curves, points, and otherwise. For example, a first entity object 312 can represent a first geometric entity of a part, a second entity object 314 can represent a second geometric entity of a part, a third entity object 316 can represent a third geometric entity of a part, and a fourth entity object 318 can represent a fourth geometric entity of a part.

The data processing system (such as data processing 100 illustrated in FIG. 1) can create assignment objects 322, 324, 326, and 328 assigning each of the material objects to the entity objects. For example, the first assignment object 322 can assign the first material object 302 to the first entity object 312, the second assignment object 324 can assign the second material object 304 to the second entity object 314, the third assignment object 326 can assign the third material object 306 to the third entity object 316, and the fourth assignment object 328 can assign the fourth material object 308 to the fourth entity object 318. In an embodiment, each of the assignment objects can be created in CAD.

Each of the assignment objects can also indicate a type of entity and a volume, length, area, or count of material to be used for the entity. Entity types can include a core type, a covering type, a joining type, a spot-weld type, and otherwise. The entity type can determine the dimensionality of the assigned material which can be used to calculate the amount (such as mass) of material in an assignment. For example, a core entity type can constitute material of a solid body. With core type entity objects, the dimensionality can be volume and the formula for calculating mass of material assignment can be volume*material density. A covering entity type can constitute material on surface such as paint, finishes, glue/adhesives, and otherwise. With covering type entity objects, the dimensionality can be surface area and the formula for calculating mass of material assignment can be surface area*mass per unit area (such as $Kg/m^2$). A harness entity type can constitute material of a wire or cable. With harness type entity objects, the dimensionality can be length and the formula for calculating mass of material assignment can be length*mass per unit length (such as Kg/m). A joining entity type can constitute joining material such as a seam welding along an edge. With joining type entity objects, the dimensionality can be length and the formula for calculating mass of material assignment can be length*mass per unit length (such as Kg/m). A spot joining entity type can constitute joining material such as a spot weld at a point. With spot joining type entity objects, the dimensionality can be volume per spot and the formula for calculating mass of material assignment can be volume per spot*number of spots*material density. A sheet metal entity type can constitute material of a sheet metal part. With sheet metal type entity objects, the dimensionality can be a flat pattern area and the formula for calculating mass of material assignment can be flat panel area*mass per unit area (such as $Kg/m^2$).

As illustrated in FIG. 3A, assignment object 322 can be of a core type entity based on the entity object 312 being of a solid body type. Thus, the mass of the material tracked by assignment object 322 can be the product of the volume of the entity object 312 and the density of the material identified by the material object 302. Assignment object 324 can be of a covering type entity based on the entity object 314 being of a surface type. Thus, the mass of the material tracked by assignment object 324 can be the product of the surface area of the entity object 314 and the mass per unit area of the material identified by the material object 304. Assignment object 326 can be of a joining type entity based on the entity object 316 being of a curve type. Thus, the mass of material tracked by assignment object 326 can be the product of the length of the entity object 316 and the mass per unit length of the material identified by the material object 306. Assignment object 328 can be of a spot joint or spot weld type entity based on the entity object 318 being of a point type. Thus, the mass of material tracked by assignment object 328 can be the product of the volume of the spot of the entity object 318, the number of spots of the entity object 318, and the material density of the material identified by the material object 308. As such, the sum of all entity masses becomes the calculated mass of design object 330 that can be stored as part of the design object 330 of the PDM system using the data processing system.

The data processing system can generate a design object 330 in the PDM system based on the assignment objects assigning each of the material objects with the entity objects. The design object 330 can serve as the container for information on each of the geometric entity or entity types, each of the materials used for each geometric entity of the part as well as the volume of material used for each geometric entity of the part. The data processing system can track the material types and material volumes for each material type based on one or more design objects stored in the PDM system. For example, a PDM system may have stored a plurality of designed objects. Of the plurality of designed objects, one or more designed objects may have one or more geometric entities made of the material, aluminum. The data processing system can identify the one or more designed objects that have one or more geometric entities made of aluminum, determine the volume of aluminum used for each geometric entity of each of the designed objects, and determine the total volume of aluminum used for every geometric entity of every identified design object.

Figure 3B:
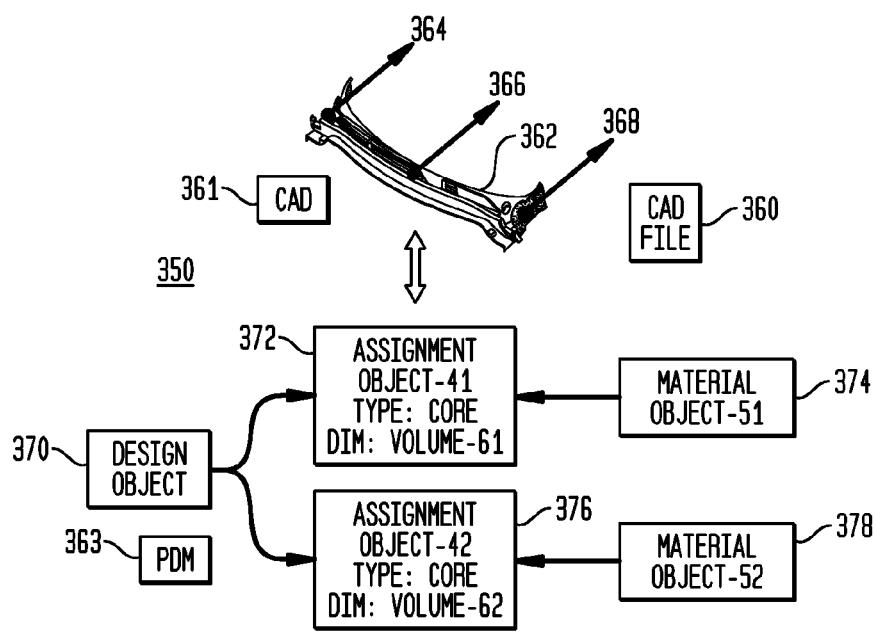
FIG. 3B illustrates an example relationship between a CAD file of a designed part in a CAD system and a correlating design object representing the designed part in a PDM system according to this disclosure.

FIG. 3B illustrates an example relationship 350 between a CAD file 360 of a designed part 362 in a CAD system 361 and a correlating design object 370 representing the designed part 362 in a PDM system 363 according to this disclosure. As illustrated in FIG. 3B, the CAD file 360 represents an electronic illustration of the designed part 362. The designed part 362 can include three geometric entities 364, 366, and 368 each made of a particular material. For example, a first entity 364 and third entity 368 can be made of rubber while a second entity 366 can be made of ABS. The design object 370 represents the designed part 362 in PDM. Assignment objects can assign material objects to the design object 370. For example, a first assignment object 372 can assign a first material object 374, representing rubber, with the design object 370 and a second assignment object 376 can assign a second material object 378, representing ABS, with the design object 370. It should be noted that while the designed part 362 may have three entities 364, 366, and 368 (but are not limited to only three entities; other entity amounts are contemplated), the design object 370 may only be assigned the first material object 374 and the second material object 378. In an embodiment, material objects can represent materials. Thus, the first assignment object 372 may not only assign the first material object 374 with the design object 370 but can also provide the total amount of material represented by the first material object 374 (in this case rubber) by combining the volume of rubber used for the first entity 364 and the third entity 368. In other words, the number of materials assignments can be same as the number of materials in a part. The second assignment object 376 assigns the second material object 378 with the design object 370 and also provides the total amount of material represented by the second material object 378 by providing the volume of ABS used for the second entity 366. In an embodiment, assignment objects can also provide entity types for the design object 370 in CAD. Similar to previous embodiments, such as the embodiments illustrated in FIG. 3A, a total amount of material for each material type (or material object 374 and 378) can be calculated in the assignment objects 376 and 372 based on the entity type of entity objects representing the entities 364, 366, and 368 and the material properties (such as density) of each material represented by the material object 374 and 378. As such, the mass of each entity (such as entities 364, 366, and 368) of the design object 370 can be calculated and stored as part of the design object 370 of the PDM system using the data processing system. The sum of masses of all entities of the design object 370 can be stored as the calculated mass of the design object 370 in the PDM system.

Material assignment can capture the fundamental relation between geometry and material and can be the basis for precise tracking that is required for mass, CG and other math calculations. Material assignments can also be key input to material data driven design validation. Material assignments in PDM can be represented as objects that can have their own lifecycle and can be visualized, reviewed, and approved.

Figure 4:
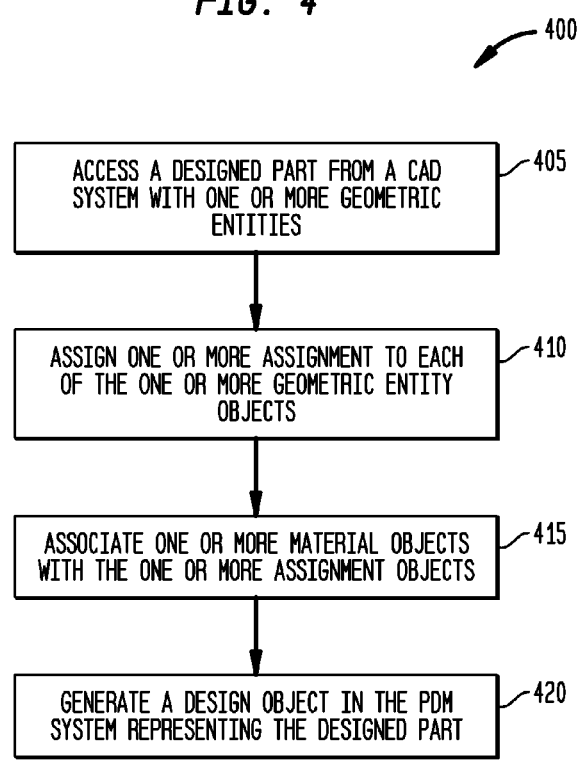
FIG. 4 illustrates a flowchart of a process in accordance with disclosed embodiments that may be performed, for example, by a data processing system in order to integrate material assignments between a CAD system and a PDM system.

FIG. 4 illustrates a flowchart of a process 400 in accordance with disclosed embodiments that can be performed, for example, by a data processing system in order to integrate material assignments between a CAD system and a PDM system. At step 405, the data processing system (such as data processing system 100 illustrated in FIG. 1) can access a designed part of an electronic file (such as a CAD file). For example, the data processing system can open or access a CAD file with a designed part including one or more geometric entity objects representing geometric entities of the designed part. Each of the one or more geometric entity objects can be associated with a material. In an embodiment, each of the one or more geometric entity objects can be associated with only one material. Access or accessing, as used herein, can include loading from storage, receiving or accessing from another device or process, receiving or accessing via an interaction with a user, or otherwise.

At step 410, the data processing system can assign one or more assignment objects from a product data management (PDM) system to each of the one or more geometric entity objects. For example the data processing system can identify one or more assignment objects which correspond to the geometric entity objects of the designed part. The one or more assignment objects can be stored in the PDM system. In an embodiment, if the data processing system is unable to identify one or more assignment objects corresponding with geometric entity objects of the designed part, the data processing system can generate one or more assignment objects correlating with geometric entity objects of the designed part and store them in the PDM system. For example, the data processing system can identify three geometric entity objects representing geometric entities of the designed part. The data processing system can identify three assignment objects using a look-up table, automation, or otherwise in the PDM system associated with the geometry of the geometric entity objects. In an embodiment, if two or more geometric entity objects have the same or similar geometry, the data processing system can identify the same assignment object for each of the geometric entity objects with the same or similar geometry and note the total volume of the geometry for all of the two or more geometric entity objects. In an embodiment, if two or more geometric entity objects have the same or similar geometry, the data processing system can identify the same assignment object for each of the geometric entity objects with the same or similar geometry and replicate the assignment object so that each geometric entity object is associated with its own assignment object.

In an embodiment, the data processing system can identify a material of each of the geometric entity objects based on an indication from the electronic file or the designed part of the electronic file.

At step 415, the data processing system can associate one or more material objects from the PDM system with the one or more assignment objects, wherein the one or more material objects identify one or more materials identified from the designed part. For example, the data processing system can identify one or more material objects in the PDM system which can represent each material of the geometric entity objects and associate the material objects with assignment objects. Accordingly, each assignment object associated with a geometric entity object can also be associated with a material object so that assignment objects can indicate the mass of material required to fill the space occupied by the geometric entity represented by the geometric entity object in the electronic file system (and the assignment object in the PDM system). In an embodiment, the data processing system can access a storage device in the PDM system to obtain a material object representing an identified material of a geometric entity of the designed object. The data processing system can also generate a material object, for example, when a material object representing a material of a geometric entity is not located in the storage. In an embodiment, the data processing system can identify a material of each of the geometric entity objects based on an indication from the electronic file or the designed part of the electronic file. In an embodiment, each assignment object can be previously associated with a particular material such that even though two assignment objects are associated with the same geometry, the two assignment objects are distinct because they are previously associated with different materials.

At step 420, the data processing system can generate a design object in the PDM system representing the designed part based on the one or more assignment objects and the one or more material objects. For example, because each assignment object can be assigned with a material object representing a geometric entity of the designed part of the electronic file, the assignment object can represent in the PDM system a geometric entity and the material of the geometric entity from the electronic file system (such as a CAD system). Each assignment object can provide an indication of the type of geometric entity represented by the geometric entity object and the material of the geometric entity based on the assigned material object. In an embodiment, the assignment object can indicate the volume of space occupied by the represented geometric entity based on the geometric entity object and the mass of material (identified by the associated material object) needed to fill that volume.

In an embodiment, the data processing system can cross-associate the material objects in the PDM system representing materials with the one or more assignment objects representing geometric entity objects of the electronic file (such as a CAD file). The data processing system can cross-associate the material objects in the PDM system with the one or more assignment objects representing geometric entity objects of the electronic file in response to receiving an indication that the electronic file was saved in the PDM system, in response to receiving a user input, or otherwise.

In an embodiment, the data processing system can track (or search) one or more assignment objects in an electronic file based on the material objects in the PDM system and can track (or search) a material object in the PDM system based on one or more assignment objects. For example, a material object representing copper in the PDM system may have been associated with a first entity object and a third entity object of an electrical connection device in the electronic file (such as a CAD file). The data processing system can search material objects representing copper in the PDM system in order to identify an assignment object in the PDM system correlating with a first entity object in the electronic file and an assignment object in the PDM system correlating with the third entity object in the electronic file based on their association with copper (or the material object representing copper).

In another example, a tool in an electronic file can include a first entity object, a second entity object, and a third entity object. The first entity object and the third entity object may be associated with stainless steel while the second entity object may be associated with iron. Each of the entity objects can be represented by assignment objects (such a first, second, and third assignment objects) in the PDM system and each of the assignment objects can be associated with material objects representing stainless steel and iron. By tracking the first assignment object, the data processing system can identify that the first entity object is associated with stainless steel and identify that the third entity object is also associated with stainless steel. While the above examples disclose cross-association between material objects and assignment objects of a single design object in the PDM system, the data processing system can cross-associate between a plurality of material objects and assignment objects of different design objects in a PDM system. Tracking can be used to subsequently change a material object associated with a particular assignment object, change, or replace one or more material objects with one or more different material objects for one or more assignment objects.

FIG. 5 illustrates a flowchart of a process 500 in accordance with disclosed embodiments that may be performed, for example, by a data processing system in order to cross-associate material objects in the PDM system with the one or more geometric entity objects of an electronic file. At step 505, the data processing system can receive a trigger (such as automatically saving an electronic file in the PDM system or a user input) to initiate the cross-association process.

At step 510, the data processing system can access a database or storage with one or more different electronic files and locate and cluster every geometric entity object that has been assigned with a particular assignment object and associated material object. In an embodiment, the data processing system can combine or sum the total material usage (such as the volume or mass) of all the geometric entity objects of the cluster assigned with the particular assignment object and associated material object.

In an embodiment, the data processing system can identify entity clusters required for creating assignment objects, based on the type of the entity objects that are assigned with a particular assignment object.

At step 515, the data processing system can identify and associate an assigned PDM material object ID of the assigned assignment object from the PDM system to all of the clustered geometric entity objects in the CAD representation. In an embodiment, the data processing system can designate the assigned PDM material object ID to the clustered geometric entity objects as the cluster material tracking ID.

At step 520, the data processing system can create a material assignment object in the PDM system with references to a design object that manages the electronic file and the assigned material object. In an embodiment, the data processing system can also store cluster material usage on the material assignment object.

At step 525, the data processing system can repeat this process for each unique material object that is assigned in the electronic file. As similarly disclosed herein, while the above examples disclose cross-association between materials from the PDM system and geometric entities in a single electronic file, the data processing system can cross-associate between a plurality of material objects in the PDM system and geometric entity objects in a plurality of different electronic files.

As disclosed herein, the number of material assignments created can be the same as the number of materials in a part. All assignments that have the same material object and the same application type can be clustered into one assignment with the combined material usage. In an embodiment, the data processing system can provide a bi-directional associativity between CAD and a PDM system which can provide many advantages. For example, even though many of the initial material object assignments of a part are made via CAD during the design phase, a different material object can be assigned to the part during procurement using a PDM system in place of the initial material object due to the discovery of a cheaper or more suitable material. The data processing system can allow for communication between the PDM system and the CAD system. For example, after a material object associated with an assignment object is changed to a different material object in the PDM, the material assigned to the geometric entity object of the designed part in the CAD system which correlates with the assignment object can also be changed to the different material. As such, the different material objects can be assigned to the designed part from the PDM system as well as the CAD system.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke 35 USC §112(f) unless the exact words "means for" are followed by a participle.

What is claimed is:

1. A method for integrating material assignments between a computer-aided design (CAD) system and a product data management (PDM) system, the method performed by a data processing system and comprising:
   accessing a designed part in the CAD system, wherein the designed part includes one or more geometric entity objects;
   assigning one or more assignment objects from the PDM system to each of the one or more geometric entity objects;
   associating one or more material objects from the PDM system with the one or more assignment objects, wherein the one or more material objects identify one or more materials identified from the designed part; and
   generating a design object in the PDM system representing the designed part based on the one or more assignment objects and the one or more material objects.

2. The method of claim 1, further comprising cross-associating a material object of the one or more material objects in the PDM system with the one or more geometric entity objects of the designed part based on the association of the one or more material objects with an assignment object.

3. The method of claim 2, wherein cross-associating the material object of the one or more material objects in the PDM system with the one or more geometric entity objects of the designed part comprises cross-associating in response to a trigger comprising one of receiving an indication that the design object was saved in the PDM system and receiving a user input.

4. The method of claim 1, wherein each assignment object indicates a type of geometric entity represented by the geometric entity object assigned with a particular material object and a volume of space occupied, area, length, or count by each represented geometric entity.

5. The method of claim 2, wherein cross-associating the material object in the PDM system with the one or more geometric entity objects of the designed part comprises accessing a database with one or more different designed parts and locating and clustering every geometric entity object that has been assigned with the same material object.

6. The method of claim 2, wherein cross-associating the material object in the PDM system with the one or more geometric entity objects of the designed part comprises identifying and associating an assigned PDM material object ID of the associated PDM material to all of the clustered geometric entities.

7. The method of claim 2, wherein cross-associating the material object in the PDM system with the one or more geometric entity objects of the designed part comprises creating an assigned material object in the PDM system with references to a design object that manages the CAD file and the assigned material object.

8. A data processing system comprising:
a processor; and
an accessible memory, the data processing system particularly configured to:
  access a designed part in a computer-aided design (CAD) system, wherein the designed part includes one or more geometric entity objects;
  assign one or more assignment objects from a product data management (PDM) system to each of the one or more geometric entity objects;
  associate one or more material objects from the PDM system with the one or more assignment objects, wherein the one or more material objects identify one or more materials identified from the designed part; and
  generate a design object in the PDM system representing the designed part based on the one or more assignment objects and the one or more material objects.

9. The data processing system of claim 8, wherein the data processing system is configured to cross-associate a material object of the one or more material objects in the PDM system with the one or more geometric entity objects of the designed part based on the association of the one or more material objects with an assignment object.

10. The data processing system of claim 9, wherein the data processing system is further configured to cross-associate a material object of the one or more material objects in the PDM system with the one or more geometric entity objects of the designed part in response to a trigger comprising one of receiving an indication that the design object was saved in the PDM system and receiving a user input.

11. The data processing system of claim 8, wherein each assignment object indicates a type of geometric entity represented by the geometric entity object assigned with a particular material object and a volume of space occupied, area, length, or count by each represented geometric entity.

12. The data processing system of claim 9, wherein the data processing system is configured to cross-associate the material object in the PDM system with the one or more geometric entity objects of the designed part comprises accessing a database with one or more different designed parts and locating and clustering every geometric entity object that has been assigned with the same material object.

13. The data processing system of claim 9, wherein the data processing system is configured to cross-associate the material object in the PDM system with the one or more geometric entity objects of the designed part comprises identifying and associating an assigned PDM material object ID of the associated PDM material to all of the clustered geometric entities.

14. The data processing system of claim 9, wherein the data processing system is configured to cross-associate the material object in the PDM system with the one or more geometric entity objects of the designed part comprises creating an assigned material object in the PDM system with references to a design object that manages the CAD file and the assigned material object.

15. A non-transitory computer-readable medium encoded with executable instructions that, when executed, cause one or more data processing systems to:
  access a designed part in a computer-aided design (CAD) system, wherein the designed part includes one or more geometric entity objects;
  assign one or more assignment objects from a product data management (PDM) system to each of the one or more geometric entity objects;
  associate one or more material objects from the PDM system with the one or more assignment objects, wherein the one or more material objects identify one or more materials identified from the designed part; and
  generate a design object in the PDM system representing the designed part based on the one or more assignment objects and the one or more material objects.

16. The computer-readable medium of claim 15, wherein the data processing system is configured to cross-associate a material object of the one or more material objects in the PDM system with the one or more geometric entity objects of the designed part based on the association of the one or more material objects with an assignment object.

17. The computer-readable medium of claim 16, wherein the data processing system is further configured to cross-associate a material object of the one or more material objects in the PDM system with the one or more geometric entity objects of the designed part in response to a trigger comprising one of receiving an indication that the design object was saved in the PDM system and receiving a user input.

18. The computer-readable medium of claim 15, wherein each assignment object indicates a type of geometric entity represented by the geometric entity object assigned with a particular material object and a volume of space occupied, area, length, or count by each represented geometric entity.

19. The computer-readable medium of claim 16, wherein the data processing system is configured to cross-associate the material object in the PDM system with the one or more geometric entity objects of the designed part comprises identifying and associating an assigned PDM material object ID of the associated PDM material to all of the clustered geometric entities.

20. The computer-readable medium of claim 16, wherein the data processing system is configured to cross-associate the material object in the PDM system with the one or more geometric entity objects of the designed part comprises creating an assigned material object in the PDM system with references to a design object that manages the CAD file and the assigned material object.

* * * * *